United States Patent [19]

Lang et al.

[11] 4,327,432
[45] Apr. 27, 1982

[54] VIDEO DISC PLAYER WITH RFI REDUCTION CIRCUIT

[75] Inventors: Frank B. Lang, Princeton Junction; Jon K. Clemens, Skillman, both of N.J.

[73] Assignee: RCA Corporation, New York, N.Y.

[21] Appl. No.: 204,828

[22] Filed: Nov. 7, 1980

[51] Int. Cl.³ .............................................. H04N 5/80
[52] U.S. Cl. .................................... 369/126; 360/38; 358/128.5; 455/303; 375/102
[58] Field of Search ..................... 358/127, 128.5, 155, 358/167, 177; 455/296, 303; 360/38; 369/126, 128, 129, 124, 53; 179/1 P; 330/252; 375/102, 104

[56] References Cited

U.S. PATENT DOCUMENTS 2,996,576  8/1961  Dolby .................................... 360/38
3,605,018  9/1971  Coviello .............................. 455/303
4,021,852  5/1977  Hurst .................................... 360/38
4,039,959  8/1977  Pattontyus-Abraham ......... 375/104
4,189,745  2/1980  Ushio .................................... 360/38
4,203,134  5/1980  Christopher ......................... 360/38
4,238,777  12/1980  Okada ................................. 360/38

Primary Examiner—John H. Wolff
Assistant Examiner—Alan Faber
Attorney, Agent, or Firm—E. M. Whitacre; J. S. Tripoli

[57] ABSTRACT

Under certain conditions a video disc player can be responsive to externally applied interference signals to provide a defect in the display of the information recovered from the disc. Apparatus is provided between the pickup circuits and the normal defect compensation apparatus of the player to detect the presence of the external signals and to activate the normal defect compensation apparatus when the external signals are of a relatively high frequency and above a certain amplitude level.

8 Claims, 3 Drawing Figures

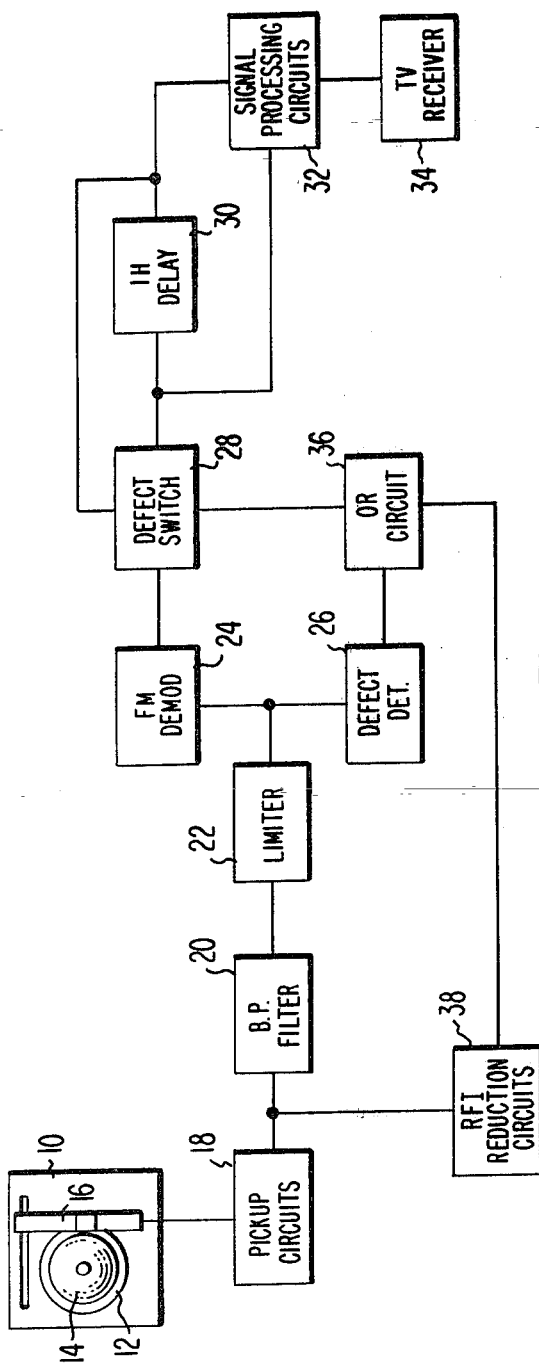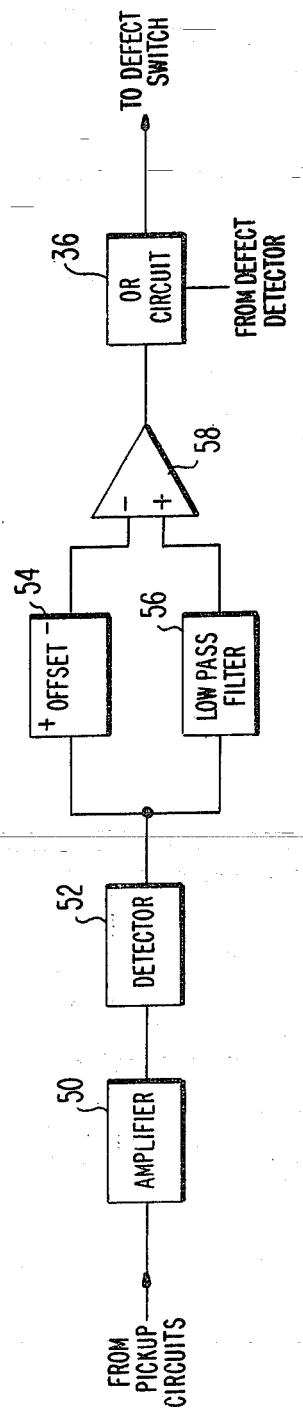

VIDEO DISC PLAYER WITH RFI REDUCTION CIRCUIT

The present invention relates generally to video disc players and more particularly to video disc players having radio frequency interference reduction apparatus.

In certain types of video disc players, such as, for example, capacitive pickup video disc players, the signal pickup circuitry includes an oscillator operating in conjunction with a tuned circuit and a peak detector. An example of such pickup circuitry may be found in U.S. Pat. No. 4,080,625 issued to H. Kawamoto et al. on Mar. 21, 1978. The oscillator frequency in such systems is generally set at a value falling within the ISM (industrial, scientific, medical) allocation band, for example, 915 MHz. The power output of this oscillator at 915 MHz is usually low and does not generally represent a signficant problem in terms of r.f. radiation outward. However, there are certain types of equipment which operate at high power levels in the ISM band, such as radars for example, and, if a number of conditions are met (such as frequency, power level, directivity and location, etc.) these outside sources of radiation can have an adverse affect on the playback operation of the video disc system.

This undesirable mode of operation appears to manifest itself in the following way. When an outside source is radiating at levels which are higher than those anticipated by the pickup circuit detector in normal player operation, the extraneous detected output signal is supplied to an FM detector which locks onto the extraneous signal. The extraneous signal is then demodulated and passed through the player signal processing circuits and displayed on the television receiver. If the extraneous signal is a pulse of short duration, say two microseconds, then the demodulated version may appear on the output television display as a short interval of black or white on a horizontal line. This results from the fact that in FM systems of the type under consideration detection of high carrier frequencies is decoded as tending toward "white" level signals and detection of low carrier frequencies is detected as tending toward "black" level signals. These short duration interference signals may be noticeable to the discerning eye.

When the external source is of greater duration, say 125 microseconds, the effect is much more noticeable in the output display. Since one television horizontal line in the NTSC format is about 63 microseconds long, a condition may arise wherein two lines of the display will be white or black. Now if the outside source is a periodic type source, then two lines of the display will show up incorrectly on a corresponding periodic basis. This is noticeable even more than the previously mentioned situation.

There are various combinations of outside source power levels and durations which may produce other undesirable results in the final display such as a combination of light and dark spots on one or more horizontal lines of the display and even picture rolling if the FM demodulator falsely locks on to an extraneous signal when the vertical synchronization signal should normally be detected. In respect of all of the above identified display problems, it is desirable to provide a means to at least reduce the effects of the interference to a level which most observers would not even notice.

Again, it should be noted that the problems mentioned arise only under a certain set of conditions.

The present invention provides a means for reducing the affects of outside radio frequency interference (RFI) in the operation of a video disc player of the type which includes a pickup circuit means coupled to an FM demodulator. The FM demodulator passes the FM detected signal to a defect compensation means which includes a defect switch and a delay line. The FM demodulator is also coupled to a defect detector which senses normal defects, that is, when the FM carrier deviation is beyond certain deviation limits. The normal operation of the defect compensation means is to recirculate and reprocess a previous line of demodulated information when the defect detector operates the defect switch. In accordance with the present invention, a radio frequency interference reduction circuit is connected between the output of the pickup circuit means and the defect switch. The RFI reduction circuit, in one embodiment, comprises an amplifier, coupled to a detector, which in turn is connected to two conduction paths. The two conduction paths are connected to a differential signal comparator circuit. One of the two paths is a wideband path and the other path includes a low pass filter which does not pass abrupt changes in the signal provided at the output of the pickup circuit. Either one of the paths may have a d.c. offset voltage applied thereto. The net effect is that the differential input to the comparator provides an output in response to rapid amplitude variations in the output signal of the pickup circuit. When such a situation is detected, the comparator provides a signal to the defect switch, through an OR circuit to cause recirculation of a previously detected line of information for the duration of the detected defect. The OR circuit is used so that the recirculation may be accomplished for either the abnormal carrier deviations caused by disc defects or the abnormal occurrence of a detected extraneous outside signal.

A detailed description of a preferred embodiment of the present invention is shown in the drawing in which:

FIG. 1 is a block diagram representative of a video disc player including the RFI reduction circuit of the present invention;

FIG. 2 is a block diagram of the RFI reduction circuit of FIG. 1; and

Figure 3:
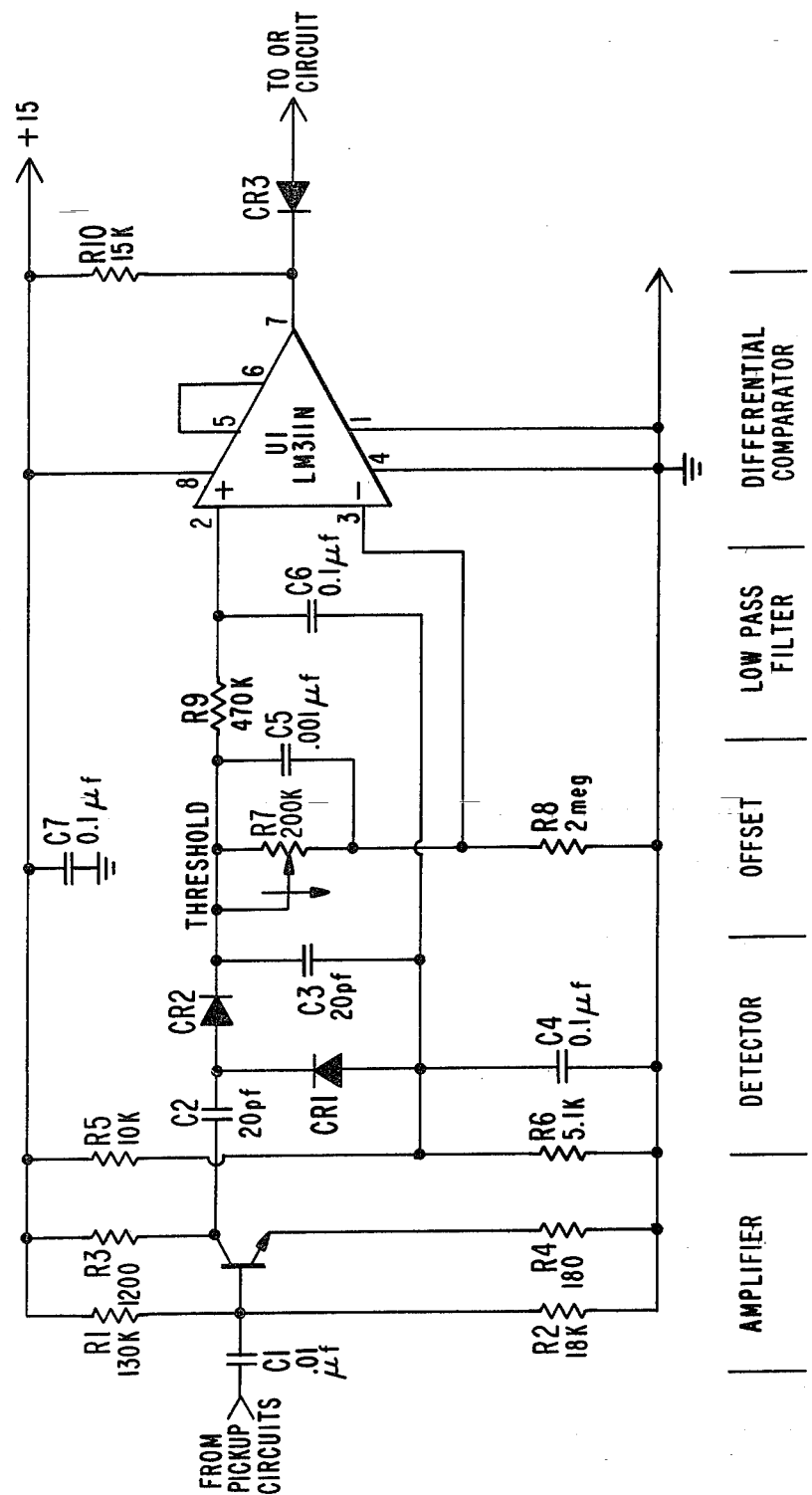
FIG. 3 is a detailed schematic diagram of the RFI circuit of FIG. 2.

In FIG. 1, a video disc player 10 is shown including a turntable 12 for supporting a video disc record 14 of the capacitance type. The player 10 also includes a carriage 16 which carries a pickup cartridge therein. Typically, the carriage moves in a timed relation to the speed of rotation of turntable 12 during playback.

Electrically coupled to the cartridge in the carriage 16 are the pickup circuits 18 of the general type described in the Kawamoto patent. Although shown as a box separated from the carriage 16, these circuits are preferably housed in the carriage. As described in Kawamoto, the output signal from pickup circuitry 18 is a frequency modulated signal. This signal is bandpass filtered at 20. The signal at the output of filter 20 corresponds to the video information recorded on the disc. The video is recorded on a 5 MHz carrier with the black level causing zero deviation, sync tips at 4.3 MHz deviation and peak white at 6.3 MHz deviation. The FM audio carrier is at 716 KHz with a deviation of plus and minus 50 KHz. For purposes of discussing the present invention, only the video signal path will be considered and thus the bandpass filter 20 only passes the video frequencies of interest. The video signal is limited in limiter 22 to provide an appropriate signal to the FM demodulator 24 and defect detector 26.

FM demodulator 24 is a phase-locked-loop type and defect detector 26 is a latching comparator type. Both of these devices are of the type disclosed in U.S. Pat. No. 4,203,134 issued to T. J. Christopher et al. on May 13, 1980. The Christopher et al. patent also describes the function and operation of the defect switch 28, the 1 H delay line 30 and the signal processing circuits 32 for providing a signal for display on the TV receiver 34. For an even more detailed description and explanation of the function and operation of elements 30 and 32 reference should be made to U.S. Pat. No. 4,195,309 issued to T. J. Christopher et al. on Mar. 25, 1980.

In general terms, the circuit of FIG. 1 thus far described performs as follows. The pickup circuits 18 provide a frequency modulated signal which is filtered at 20 to develop the video FM signal which is then limited at 22. In the FM demodulator 24, the phase of the recovered signal is compared to the phase of a signal from a voltage controlled oscillator (VCO) to develop a signal which when low pass filtered provides a demodulated version of the video information. The defect detector 26 compares the recovered signal with the output of the VCO in the demodulator 24 and when the phase of the recovered signal is out of a certain range relative to the VCO signal, a defect indication pulse is generated and provided through circuitry which includes an OR function 36. A defect signal coupled via the OR circuitry 36 is used to operate the defect switch 28. When operated switch 28 causes information signals which were previously recovered to be re-used by passing signals coupled from the output of the 1 H delay line 30. The recirculation or re-use of previously recovered information continues for as long as the switch 28 is held in the re-use position.

Now, in accordance with the present invention, the arrangement of FIG. 1 further comprises a radio frequency interference reduction apparatus 38 which may comprise several circuit functions. RFI reduction apparatus 38 is electrically connected between the output terminal of the pickup circuits 18 and an input terminal of the OR circuit 36. Apparatus 38 could be connected to the output of filter 20 since the filtered signal includes the information used in the operation of the RFI reduction scheme. Apparatus 38 is used to detect anomalous signals from outside sources, as discussed above, and develop an appropriate signal which will activate the defect switch 28, via the OR circuit 36. By so doing, apparatus 38, in cooperation with the other elements mentioned, causes previously recovered information to be recirculated through switch 28 so that instead of seeing white or black lines appearing across the display, something more like that which should appear will be displayed. In most cases, the substitution of one line or less as described above cannot be noticed by the general observer. Even the substitution of the same line twice in a sequence, which is on the order of a 125 microsecond defect, is barely noticeable to most observers.

It will be recalled that the output signals from the defect detector 26 and the RFI reduction apparatus 38 are OR'ed at 36. It is desired to have the normal defect detection and substitution take place in the usual fashion so that out of band deviations due to signal defects are handled in the usual way. At the same time, when a strong abrupt outside signal gets picked up the system should see this and respond with a substitution recirculated through switch 28. Care must be taken to set the proper limits on both defect detections to avoid unnecessary signal substitutions.

A block diagram of the RFI reduction apparatus is shown in FIG. 2. The signal from the pickup circuits 18 is coupled to an amplifier 50. Amplifier 50 sets up the amplitude level of the recovered signal for further processing. A peak detector 52 responds to the amplifier output signal to detect the envelope of the amplified, recovered signal. The detected envelope is then provided to two conductive paths. One of the two paths includes an offset voltage provided by offset circuit 54. The other path includes a low pass filter 56. These two paths are coupled to a differential comparator circuit 58. In FIG. 2 the upper path is a wideband path which adds the d.c. offset to the detected signal (the offset may be in either path). This offset provides a threshold so that small variations in the signal provided from the pickup circuits 18 do not cause the defect switch to be activated. The lower path includes the low pass filter 56 which does not pass rapid changes in the signal but does pass low frequency variations as well as the d.c. component. The net effect resulting from the coupling of signals to the input terminals of the differential comparator 58, as shown in FIG. 2, is that comparator 58 responds only to the rapid, low duty cycle amplitude variations of the signal from the pickup circuits 18 when such variations exceed the offset voltage. Relatively slow amplitude changes appear as a common mode signal to the comparator and thus do not cause the comparator to put out a signal to actuate the defect switch 28.

Now it will be understood why the selection of the offset voltage is important. If the offset is set too low, then the defect switch can be activated for amplitude variations that are not caused by interference. If the offset is set too high, then interfering signals may get through, at a moderate level, undetected to cause undesirable results in the output display.

FIG. 3 shows a specific embodiment for the RFI reduction apparatus 38. The output signal from the pickup circuits 18 is coupled via capacitor C1 to the base of transistor Q1. The amplified output is taken from the collector of Q1 and provided to the peak detector which includes capacitors C2 and C3 and diode CR1 and CR2. The detector circuit produces an output signal relative to a bias potential set by resistors R5 and R6, and capacitor C4. Resistor R8 supplies detector diode forward bias to increase detector sensitivity and speed. Resistor R8 also supplies bias current for the adjustable potentiometer R7 which provides the d.c. offset on the path coupled to the negative terminal of comparator U1. Resistor R9 and capacitor C6 form the low pass filter in the conductive path connected to the positive terminal of comparator U1. Diode CR3 and resistor R10 isolate stray circuit capacity from the defect switch. Diode CR3 and resistor R10 may not be needed when the comparator used has an open collector output. Resistor R10 also helps to increase the operating current and speed of the output stage of comparator U1. In FIG. 3, all resistor values are in terms of ohms unless otherwise specified and all capacitors are expressed in terms of microfarads unless otherwise specified.

In a concurrently filed application (Ser. No. 204,827) in the names of C. B. Dieterich and F. B. Lang, an RFI reduction circuit is shown and described having a variable threshold arrangement in place of the fixed threshold or offset shown in FIGS. 2 and 3.

What is claimed is:

1. In a video disc player of the type having:
    pickup apparatus for recovering an information signal recorded on a disc in the form of a modulated carrier signal; demodulation apparatus; defect detection apparatus for detecting defects in the recovered signal; and defect compensation apparatus responsive to the operation of the defect detection apparatus for providing a substitute signal in place of the recovered signal in the playback display of said information signals during occurrences of defects in the recovered signal; said player being subject to interference with normal playback display operations due to the pickup of recorded, externally applied signals; apparatus for reducing the influence of said external signals comprising:
    circuit means connected in parallel with said defect detection apparatus between an output terminal of said pickup apparatus and an input terminal of said defect compensation apparatus and responsive to the amplitude and frequency of the signal provided by said pickup apparatus for actuating said defect compensation apparatus for reducing the influence of said externally applied signals in the playback display.

2. The apparatus according to claim 1 wherein said circuit means comprises:
    an amplifier connected to said pickup apparatus output terminal;
    a signal detector for detecting amplitude variations in the amplifier output signal;
    first and second conductive paths connected to an output terminal of said detector, said first path being responsive to a wide band of frequencies, said second path being responsive to a relatively low band of frequencies, one of said paths having a means for providing a d.c. offset;
    a voltage comparator coupled to said first and second paths for providing an output signal in reponse to a detected signal having an amplitude greater than said offset voltage and a frequency higher than said low band of frequencies; and
    means coupling said comparator output signal to said defect compensation apparatus.

3. The apparatus according to claim 2 wherein said signal detector comprises a peak detector circuit for detecting the envelope of the signal provided by said amplifier.

4. The apparatus according to claim 3 wherein said first conductive path includes means for providing a d.c. offset.

5. The apparatus according to claim 4 wherein said second conductive path includes a low pass filter.

6. The apparatus according to claim 5 wherein said comparator comprises a differential comparator having an inverting terminal and a non-inverting terminal and wherein said first conductive path is connected to said inverting terminal and said second path is connected to said non-inverting terminal.

7. The apparatus according to claim 5 wherein said means for coupling said comparator output signal to said defect compensation apparatus comprises an OR circuit having first and second input terminals and an output terminal, said first input terminal of said OR circuit being coupled to the output terminal of said comparator, the second input terminal of said OR circuit being coupled to said defect detector apparatus and the output terminal of said OR circuit being coupled to said defect compensation apparatus.

8. In a video disc player of the type having:
    pickup apparatus for recovering an information signal recorded on a disc in the form of a modulated carrier signal; demodulating apparatus; defect detection apparatus for detecting defects in the recovered signal; and defect compensation apparatus responsive to the operation of the defect detection apparatus for providing a substitute signal in place of the recovered signal in the playback display of said information signals during occurrences of defects in the recovered signal; said player being subject to interference with normal playback display operations due to the pickup of recorded, externally applied signals; apparatus for reducing the influence of said external signals comprising:
    means connected to said pickup apparatus for detecting the presence of said external signals in a given frequency band;
    selective means responsive to said detection means and connected in parallel with said defect detection apparatus for providing an output signal in response to the presence of detected signals above a certain amplitude level and in a high frequency portion of said given frequency band; and
    means for coupling the output signal of said selective means to said defect compensation apparatus.

* * * * *

UNITED STATES PATENT AND TRADEMARK OFFICE
CERTIFICATE OF CORRECTION

PATENT NO. : 4,327,432

DATED : April 27, 1982

INVENTOR(S): Frank Bowen Lang and Jon Kaufmann Clemens

It is certified that error appears in the above-identified patent and that said Letters Patent is hereby corrected as shown below:

Col. 5, line 17, "recorded" should be --unrecorded;

Col. 6, line 36, "recorded" should be --unrecorded.

Signed and Sealed this

Seventeenth Day of July 1984

[SEAL]

*Attest:*

GERALD J. MOSSINGHOFF

*Attesting Officer*  *Commissioner of Patents and Trademarks*